United States Patent [19]

Schnable et al.

[11] Patent Number: 4,733,039

[45] Date of Patent: Mar. 22, 1988

[54] METHOD OF LASER SOLDERING

[75] Inventors: George L. Schnable, Lansdale, Pa.; Peter J. Zanzucchi, Princeton Junction, N.J.

[73] Assignee: General Electric Company, Schenectady, N.Y.

[21] Appl. No.: 73,371

[22] Filed: Jul. 10, 1987

Related U.S. Application Data

[63] Continuation of Ser. No. 730,444, May 6, 1985, abandoned.

[51] Int. Cl.$^4$ .............................................. B23K 26/00
[52] U.S. Cl. ........................ 219/121 LD; 219/85 BM; 219/85 H
[58] Field of Search ................. 219/121 LD, 121 LC, 219/121 LM, 121 L, 121 LB, 85 H, 85 BM, 85 BA

[56] References Cited

U.S. PATENT DOCUMENTS

| | | | |
|---|---|---|---|
| 2,886,687 | 5/1959 | Von Kurnatowski et al. | 219/85 H |
| 2,887,772 | 5/1959 | Peck | 219/85 H |
| 3,787,873 | 1/1974 | Sato et al. | 219/121 LM X |
| 4,015,100 | 3/1977 | Gnanamuthu et al. | 219/121 LW |
| 4,531,044 | 7/1985 | Chang | 219/121 LM |

FOREIGN PATENT DOCUMENTS

| | | | |
|---|---|---|---|
| 2832317 | 1/1980 | Fed. Rep. of Germany | 219/85 H |
| 0017369 | 1/1982 | Japan | 219/85 BA |
| 0215273 | 12/1983 | Japan | 219/85 BM |
| 0634889 | 11/1978 | U.S.S.R. | 219/85 H |
| 0143052 | 7/1980 | U.S.S.R. | 219/85 H |

OTHER PUBLICATIONS

Lever, "Applying Radiant Heat to Semiconductor Integrated Circuits", *IBM Technical Disclosure Bulletin*, vol. 20, No. 10, pp. 3908–3909, 3/78.
J. R. Loeffler, Jr., *Assembly Engineering*, Mar. 1977, pp. 32–34.
E. F. Lish, *Electri-onics*, Jun. 1984, pp. 28–32.
Product Brochure of Pi Laser Systems, Inc.
H. H. Manko, Solders and Soldering, 2nd Edition, pp. 20–21 and 213.
Kodak Publication No. JJ-100, Kodak Dye 26, Chemical No. 50098, Nov. 1983.
J. Murray, "Simple Soldering Concepts", *Circuits Manufacturing*, vol. 25, No. 1, Jan. 1985, pp. 32, 34, 36 and 38.

*Primary Examiner*—C. L. Albritton
*Attorney, Agent, or Firm*—Henry I. Steckler; Allen LeRoy Limberg

[57] ABSTRACT

An additive that absorbs light at a given wavelength is added to a solder flux composition for use in laser soldering wherein the laser emits light of said given wavelength. The additive reduces the power required to melt the solder-flux combination and thereby improves soldering efficiency.

10 Claims, No Drawings

METHOD OF LASER SOLDERING

This application is a continuation of application Ser. No. 730,444, filed May 6, 1985 and now abandoned.

This invention relates to an improved laser soldering method and solder flux compositions for use therein.

BACKGROUND OF THE INVENTION

Soldering is a widely used method of joining two metals together by means of a third low-melting metal layer. Effective soldering relies on the solder metal being liquified and wetting the metals to be joined and then being cooled to resolidify the solder. A flux is normally used in this process to clean the metal surfaces to be joined, i.e., to remove surface layers of oxide, sulfide, carbonate, grease and the like formed by exposure of the metals to the atmosphere. The flux also displaces adsorbed gases on the metallic surfaces which interfere with good wetting by the molten solder.

In the most common use of solder, the solder or solder-flux combination is melted by a source of heat such as an iron. When small parts are to be joined, or small devices affixed to a metal board in a predetermined position, particularly in the electronics industry, a small directed heat source is required. Recently carbon dioxide laser beams have come into use for such applications. Lasers promote rapid solder fusion and cooling, thus avoiding formation of intermetallic compounds during soldering. They can also be finely controlled for automated assemblies and they provide a non-contacting heat source. However, the carbon dioxide lasers used heretofore are expensive and require relatively large amounts of power to activate them. However, when other lasers, such as Nd:YAG lasers, were tried as heat sources, it was found that the metallurgical properties of the bond were less than desirable and that unexpectedly high power was required to melt the solder-flux combination. Further, the operation was less efficient than expected due to inadequate heating of the solder by the laser.

SUMMARY OF THE INVENTION

We have found that for laser beam soldering the addition to the flux of an additive that absorbs light at the laser emission wavelength improves the solder bond, reduces the power required to melt the solder-flux combination and shortens the soldering time.

DETAILED DESCRIPTION OF THE INVENTION

An additive that will absorb light at the wavelength of the incident laser beam, when added to a flux, absorbs the laser light and thus increases the amount of light from the laser that can be used as a heat source, and, concomitantly, reduces the amount of light lost by reflection from the solder and metal surfaces to be joined.

Suitable additives can be organic or inorganic materials. Inorganic materials include carbon black or graphite particles, which are finely divided and can be added as a slurry to a liquid flux material, or directly to a paste flux material by simple mixing. Care should be taken that the solid particles are dispersed throughout the flux and that they do not settle out upon standing. It is important that the absorber be uniformly blended in the flux so that during the soldering operation all surfaces can be uniformly heated, particularly the underlying metal layer to be joined to the solder.

Suitable organic materials include dyes that absorb at the wavelength of interest. They can be added by dissolving in a suitable solvent, e.g. a solvent that is compatible with the flux, preferably one that is already present in the flux composition. Impurities and undissolved dye can be filtered prior to mixing with the flux composition. As an example, a dye having the formula

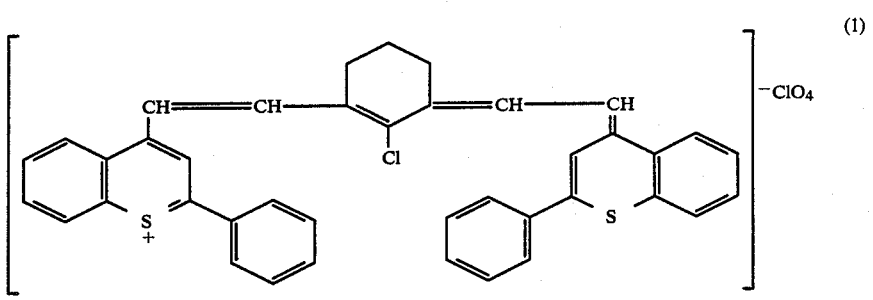

has maximum absorption at 1.08 microns and is strongly absorbent at 1.06 microns, the emission wavelength of a Nd:YAG laser. This dye is soluble in various common solvents including alcohols and glycols.

The additive is present in such concentration and is dispersed throughout the flux composition so that absorption of light takes place throughout during heating, rather than just at the flux surface, and thus the underlying metal layer to be joined is heated rapidly and uniformly. In general the amount of additives suitable is from about 0.02 to 1% by weight of the active flux composition.

In addition to good adsorption properties, the light absorber should not have a deleterious effect on the wetting of the flux and/or solder or the metals to be joined. Good solder wetting is shown by spreading of the solder on the metal surface, and by the contact angle formed between the molten solder and the underlying metal layer. For good wetting the contact angle should be less than 90 degrees, and preferably be less than 75 degrees.

A wetting agent can be added to the flux composition as is known, to improve solder spreading and to reduce the contact angle between the solder and the metal layer. We have found that ammonium chloride is particularly effective as a wetting agent for rosin type fluxes including organic dye light absorbers such as that of Formula 1 above.

The rate of increase in the temperature of a metal substrate under a laser beam and the final temperature reached in a given period of time is another measure used to determine that a sufficient amount of light absorber is present. The optimum amount of absorber required in a given system can be readily determined by one skilled in the art in a series of test runs.

The flux chosen for a particular soldering system is dependent on the materials to be joined. In the electronics industry, where highly corrosive or active fluxes such as strong inorganic or organic acids are to be avoided because of the danger of damage to delicate electronic devices, relatively inactive fluxes such as rosins are used. Rosin becomes active only at elevated temperatures, when it becomes active enough to react with or clean metals such as copper, silver and gold.

Fluxes can be used separately from the solder but are widely available commercially as a core within a lead-tin soldering wire or preform for example. Activators such as chloride, organic acids, amines, amides, acid salts and the like can also be added to the flux, as is known. Commercially available rosin fluxes do not absorb light at 1.06 microns, for example.

The invention will be further described by the following examples. However, the invention is not meant to be limited to the details described therein. In the examples, parts and percentages are by weight unless otherwise noted.

EXAMPLE 1

A finely divided carbon black, Black Pearl 2000 of the Cabot Co., was milled with a commercially available paste type rosin type flux, Alpha RMA 7 LV of the Alpha Co. in a concentration of 0.1%.

The light transmission of the flux at 1.06 microns wavelength was measured before and after the carbon black addition. The RMA 7 LV flux had no appreciable absorption at 1.06 μm. The flux containing the carbon black had a reduced transmission of about 30%.

The flux was evaluated for wettability by spreading of a standard eutectic tin-lead solder on a flux-coated copper foil substrate placed on a hot plate, using flux with and without the carbon black.

An unfluxed control displayed very poor wetting. The contact angle of a copper foil substrate coated with the above flux was less than 10 degrees without the carbon black and less than 10 degrees with the carbon black. Thus, the additive did not have an adverse effect on wettability.

The rate of temperature increase and the final temperature of a metal substrate coated with flux and heated using a Nd:YAG laser was measured by impinging the beam onto a burnished copper-constantan thermocouple connected to a chart recorder. Plots were developed for the bare thermocouple, for the thermocouple coated with the unmodified flux, and the thermocouple coated with the carbon-containing flux. The rate of temperature rise was fastest for the flux composition of the invention.

EXAMPLE 2

The procedure of Example 1 was followed except using different flux compositions. A flux was prepared by mixing 9 parts of Alpha 611 liquid flux, and 1 part of a solution of polyethylene glycol (M.W. 190–210) containing 1% of glycolic acid and 0.1% of the dye of Formula 1 given above.

The absorption of this flux at 1.06 microns was 60%. The increase in temperature rise was faster than with the flux which did not contain the dye additive. The wetting properties of this flux was not as good as that of EXAMPLE 1 (contact angle, approximately 20 degrees).

EXAMPLE 3

In an effort to improve the wettability of the dye-containing flux composition, 1% of glycolic acid and 1% of hydrazine hydrochloride was added to the polyethylene glycol dye solution. The wetting was improved. When 3% of ammonium chloride was added, wetting and solderability were excellent.

EXAMPLE 4

Another polyethylene glycol dye solution as in Example 3 was prepared to which was added 1% of ammonium chloride as a wetting agent. Wetting was greatly improved. Using a Nd:YAG laser beam, the rate of temperature rise for this flux composition was higher than for the control flux.

We claim:

1. In a method of soldering employing a flux composition and a Nd:YAG laser beam as the heat source, the improvement which comprises:

adding an effective amount of a dye having the formula

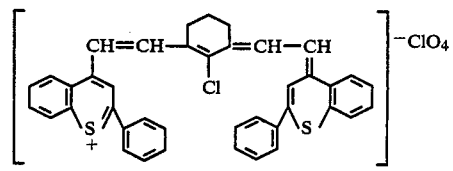

to said flux composition to increase the amount of light at the emission wavelength of said laser beam which is absorbed by said flux composition.

2. A method of soldering according to claim 1 wherein said dye is dissolved in a solvent compatible with said flux composition.

3. A method of soldering according to claim 2 wherein said flux composition further comprises glycolic acid.

4. A method of soldering according to claim 3 wherein said flux composition further comprises a wetting agent.

5. A method of soldering according to claim 4 wherein said dye is present in an amount from about 0.02 to about 1% by weight of the active flux composition.

6. A flux composition for use with a Nd:YAG laser soldering system, comprising:

a flux; and
a dye having the formula

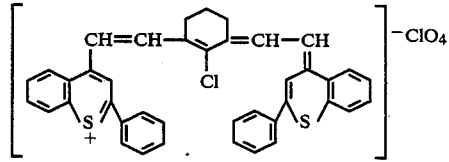

in an effective amount to increase the amount of light at the emission wavelength of a Nd:YAG laser which is absorbed by said flux composition.

7. A flux composition according to claim 6 wherein said dye is dissolved in a solvent compatible with said flux composition.

8. A flux composition according to claim 7 wherein said flux composition further comprises glycolic acid.

9. A flux composition according to claim 8 wherein said flux composition further comprises a wetting agent.

10. A flux composition according to claim 9 wherein said dye is present in amounts from about 0.02 to about 1% by weight of the active flux composition.

* * * * *